United States Patent
Lo et al.

(10) Patent No.: US 12,033,890 B2
(45) Date of Patent: *Jul. 9, 2024

(54) PATTERNING INTERCONNECTS AND OTHER STRUCTURES BY PHOTO-SENSITIZING METHOD

(71) Applicant: Taiwan Semiconductor Manufacturing Co., Ltd., Hsinchu (TW)

(72) Inventors: Wei-Jen Lo, Hsinchu (TW); Po-Cheng Shih, Hsinchu (TW); Syun-Ming Jang, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/309,131

(22) Filed: Apr. 28, 2023

(65) Prior Publication Data

US 2023/0268224 A1 Aug. 24, 2023

Related U.S. Application Data

(63) Continuation of application No. 17/094,700, filed on Nov. 10, 2020, now Pat. No. 11,676,855.

(Continued)

(51) Int. Cl.
*H01L 21/768* (2006.01)
*G03F 7/038* (2006.01)
(Continued)

(52) U.S. Cl.
CPC ........ *H01L 21/76823* (2013.01); *G03F 7/038* (2013.01); *G03F 7/039* (2013.01);
(Continued)

(58) Field of Classification Search
CPC .......... H01L 21/76877; H01L 21/0274; H01L 21/486; H01L 21/76802; H01L 21/2885;
(Continued)

(56) References Cited

U.S. PATENT DOCUMENTS

| 4,608,129 A | 8/1986 | Tamamura et al. |
|---|---|---|
| 9,235,116 B2 | 1/2016 | Inasaki et al. |

(Continued)

FOREIGN PATENT DOCUMENTS

| DE | 102018125161 B3 | 7/2019 |
|---|---|---|
| JP | 2004061629 A | 2/2004 |

(Continued)

*Primary Examiner* — Caleen O Sullivan
(74) *Attorney, Agent, or Firm* — Slater Matsil, LLP

(57) ABSTRACT

A representative method includes forming a photo-sensitive material over a substrate, and forming a cap layer over the photo-sensitive material, and patterning the cap layer. Using the patterned cap layer, a first portion of the photo-sensitive material is selectively exposed to a pre-selected light wavelength to change at least one material property of the first portion of the photo-sensitive material, while preventing a second portion of the photo-sensitive material from being exposed to the pre-selected light wavelength. One, but not both of the following steps is then conducted: removing the first portion of the photo-sensitive material and forming in its place a conductive element at least partially surrounded by the second portion of the photo-sensitive material, or removing the second portion of the photo-sensitive material and forming from the first portion of the photo-sensitive material a conductive element electrically connecting two or more portions of a circuit.

20 Claims, 7 Drawing Sheets

Related U.S. Application Data

(60) Provisional application No. 62/981,862, filed on Feb. 26, 2020.

(51) Int. Cl.
    *G03F 7/039*           (2006.01)
    *G03F 7/20*            (2006.01)
    *H01L 21/027*        (2006.01)

(52) U.S. Cl.
    CPC .......... *G03F 7/2004* (2013.01); *G03F 7/2022* (2013.01); *H01L 21/0274* (2013.01); *H01L 21/76802* (2013.01); *H01L 21/76877* (2013.01)

(58) Field of Classification Search
    CPC ......... H01L 21/76801; H01L 23/53295; H01L 21/31144; G03F 7/0035; G03F 7/0042; G03F 7/0758; G03F 7/004; G03F 7/0757; G03F 7/094
    USPC ........................................... 438/597; 430/319
See application file for complete search history.

(56) References Cited

U.S. PATENT DOCUMENTS

| | | |
|---|---|---|
| 10,861,710 B2 | 12/2020 | Kuo et al. |
| 11,676,855 B2 * | 6/2023 | Lo ..................... H01L 21/76877 438/597 |
| 2004/0089878 A1 | 5/2004 | Takehashi et al. |
| 2011/0065050 A1 | 3/2011 | Li et al. |
| 2019/0198786 A1 | 6/2019 | Shimizu et al. |

FOREIGN PATENT DOCUMENTS

| | | |
|---|---|---|
| JP | 2004087976 A | 3/2004 |
| JP | 2005003803 A | 1/2005 |
| JP | 2013020226 A | 1/2013 |
| KR | 900003155 B1 | 5/1990 |
| TW | 432707 B | 5/2001 |

* cited by examiner

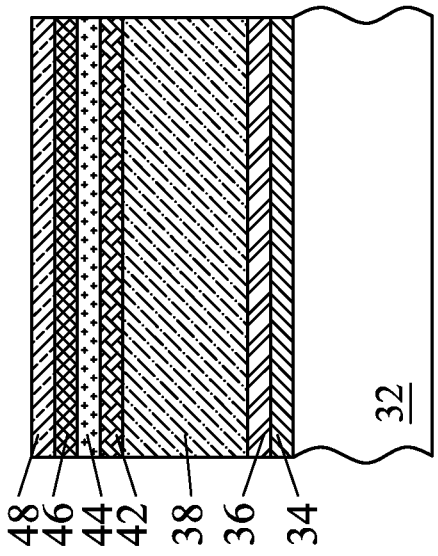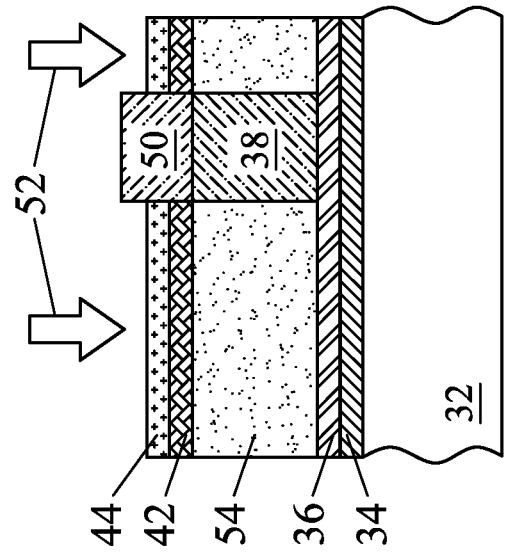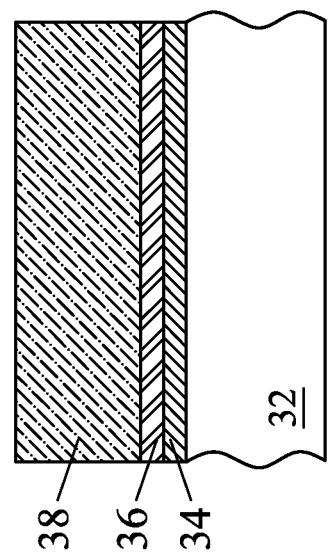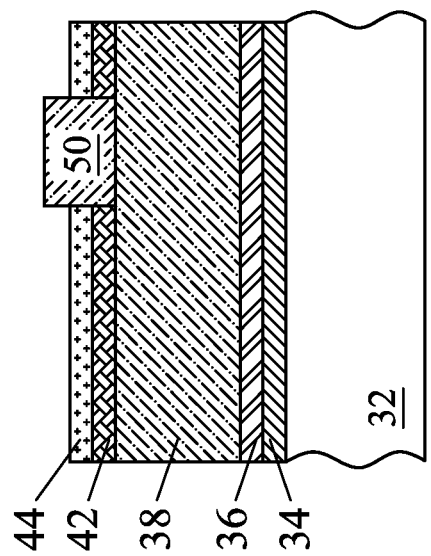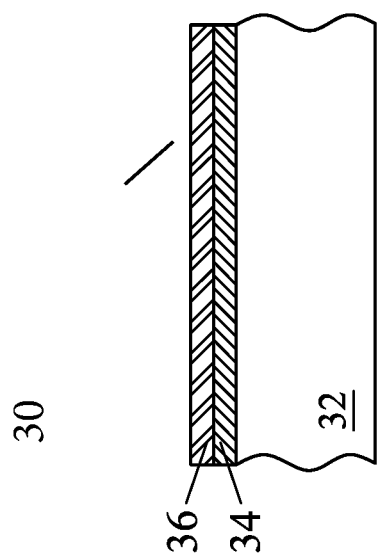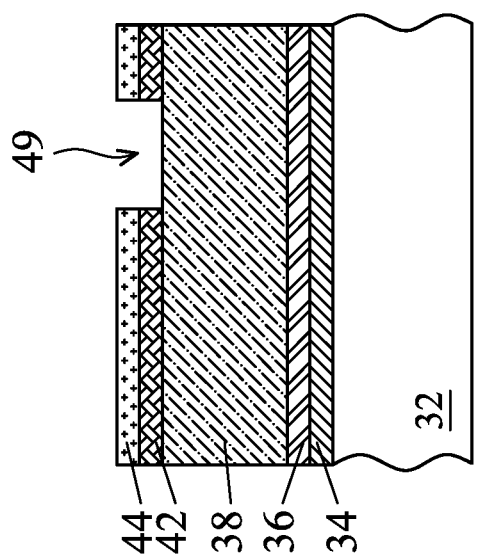

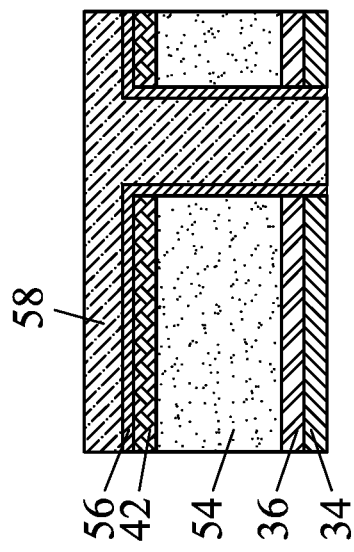
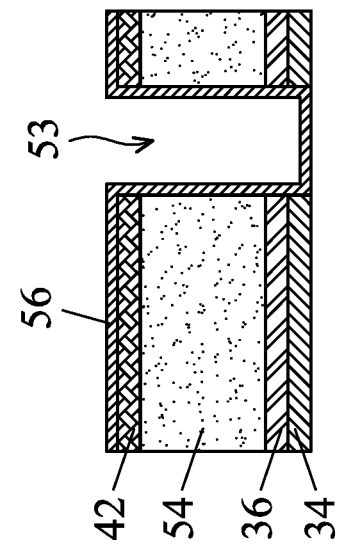
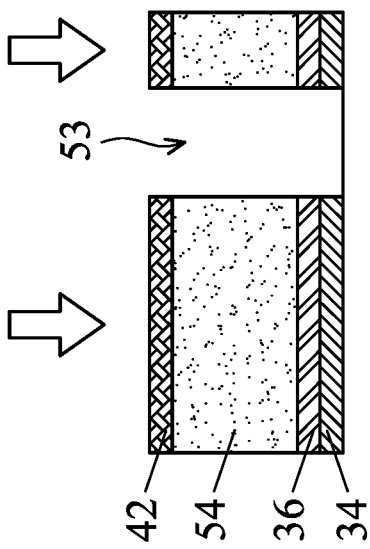
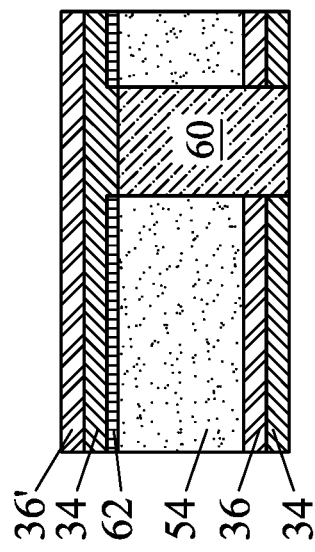
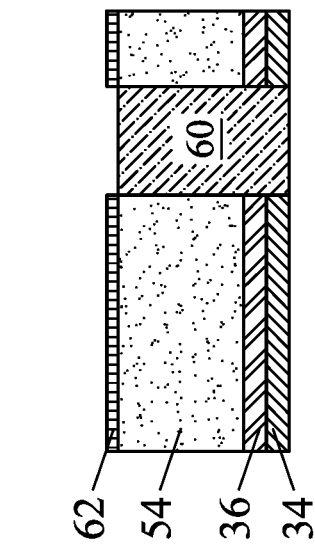
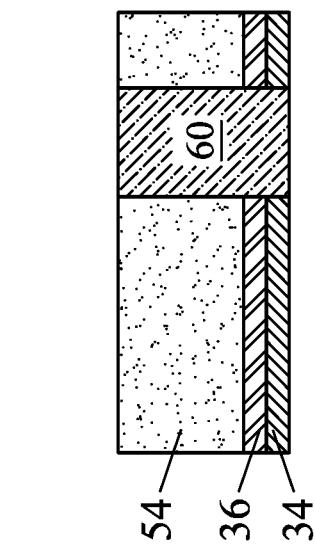

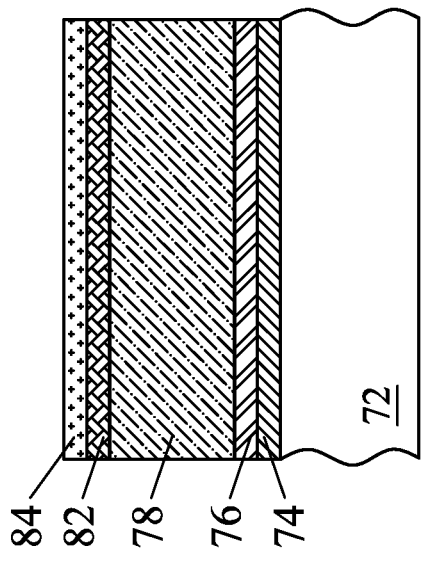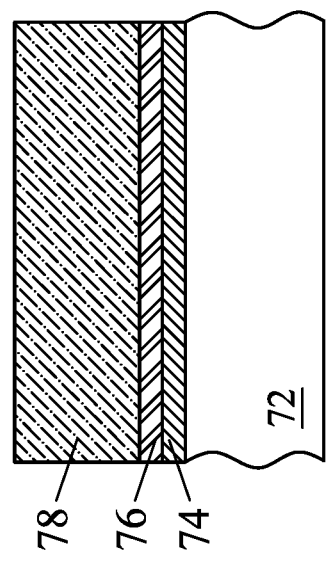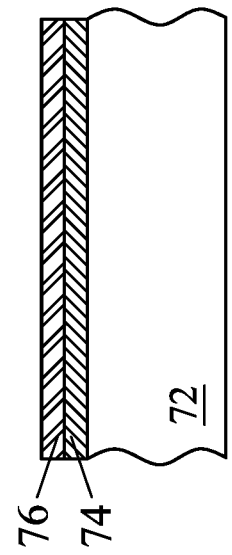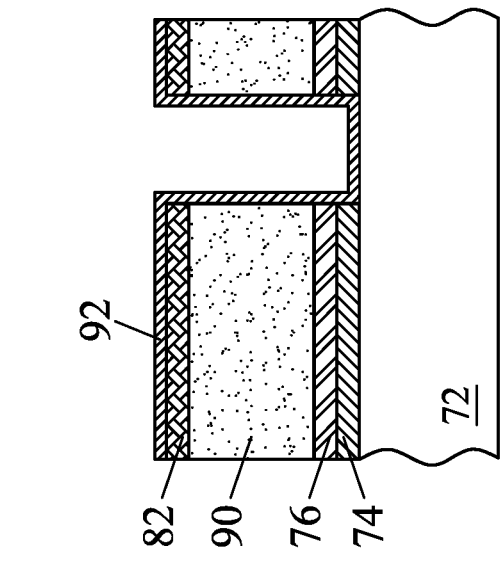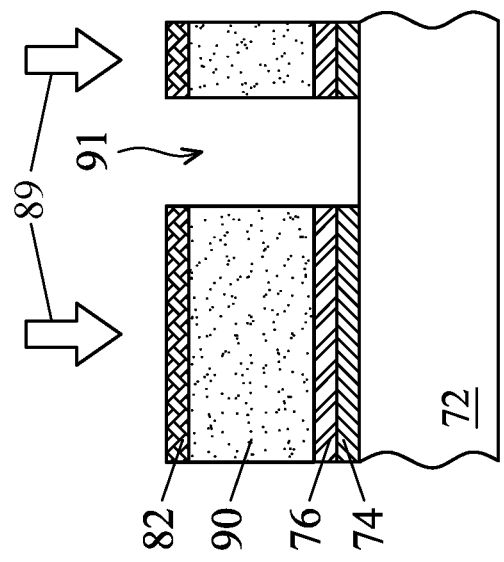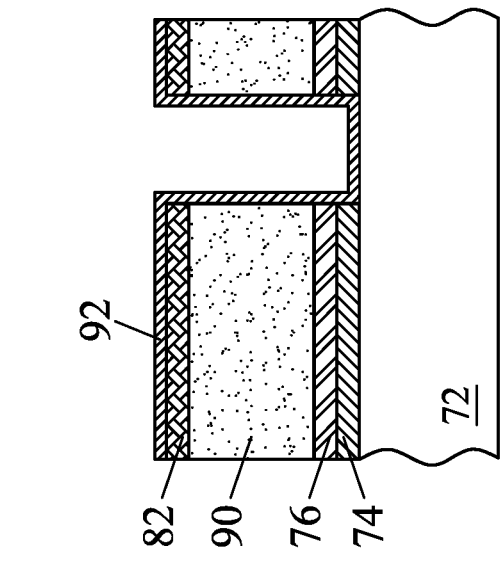

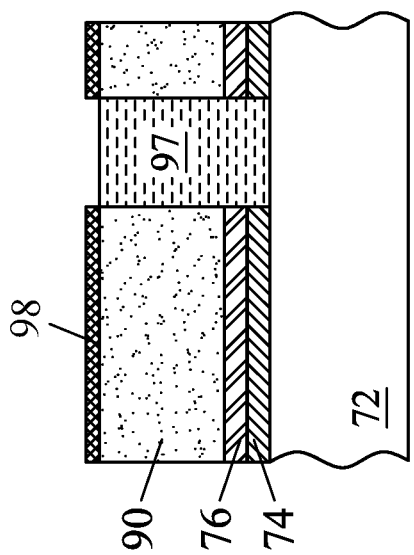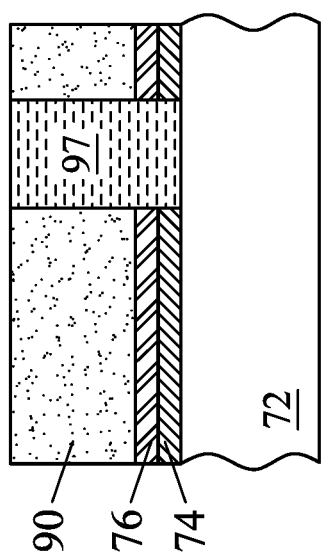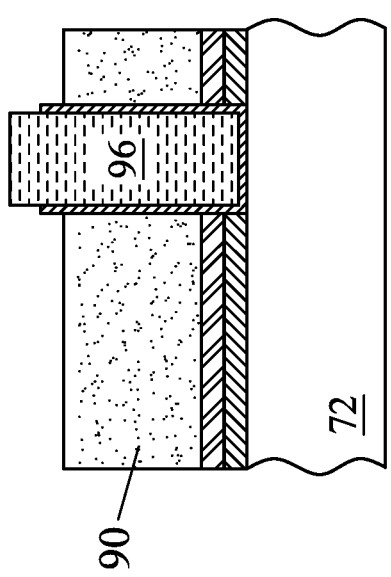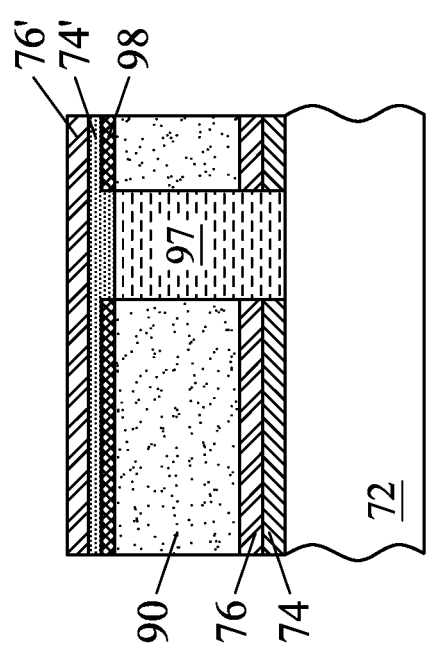
Fig. 5g
Fig. 5h
Fig. 5i
Fig. 5j

PATTERNING INTERCONNECTS AND OTHER STRUCTURES BY PHOTO-SENSITIZING METHOD

CLAIM FOR PRIORITY

This application is a continuation of U.S. patent application Ser. No. 17/094,700, filed on Nov. 10, 2020, entitled "Patterning Interconnects and Other Structures by Photo-Sensitizing Method," which claims priority to U.S. Provisional Patent Application No. 62/981,862, filed on Feb. 26, 2020, and entitled "Patterning Interconnects and Other Structures by Photo-Sensitizing Method," which applications are incorporated herein by reference.

BACKGROUND

Numerous steps in semiconductor and integrated circuit fabrication require patterning of layers, typically using photolithography techniques. As features become small and pattern density becomes correspondingly greater, new techniques are required to overcome drawbacks such as dry etch loading, complicated multi-layer mask requirements, inadvertent damage to the layer to be patterned or surrounding layers, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3a through 3f illustrate steps in forming a patterned photo-sensitive layer having conductive regions and non-conductive regions, and the structures resulting therefrom.

FIG. 4a through 4f illustrate steps in forming insulating features in the patterned photo-sensitive layer of FIG. 3f, and the structures resulting therefrom.

FIG. 5a through 5j illustrate steps in forming an electrical interconnect from a patterned photo-sensitive layer, and the structures resulting therefrom.

DETAILED DESCRIPTION OF ILLUSTRATIVE EMBODIMENTS

Figure 1C:
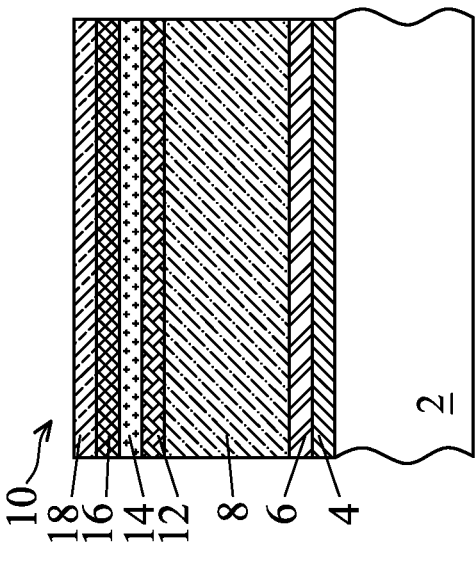
FIG. 1a through 1f illustrate steps in forming a patterned photo-sensitive layer and the structures resulting therefrom.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following described embodiments, a method of forming an interconnect feature, such as a conductive via, within a dielectric layer, such as an inter metal dielectric (IMD) is disclosed. The present teaching is equally applicable, however, to conductive lines within IMDs, conductive via and/or contact plugs within inter layer dielectric (ILD) layers, conductive pads, and the like.

Figure 1B:
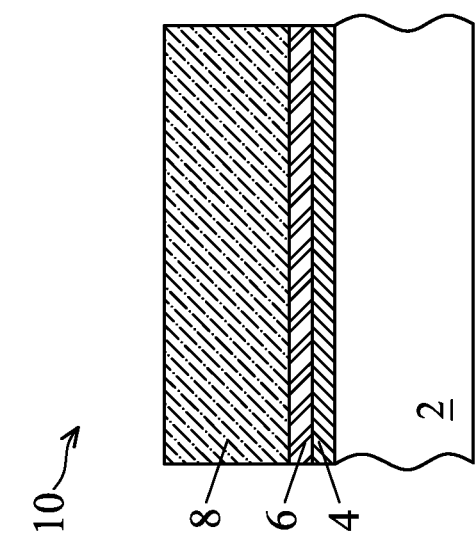
Figure 1A:
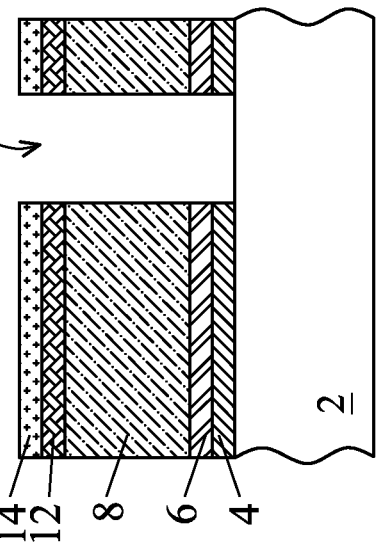

A first embodiment begins with a structure 10, which is illustrated in FIG. 1a at an intermediate stage of manufacture wherein one or more features and/or layers have been formed in and/or on a substrate 2. Substrate 2 is shown in cross sectional view and, like the other features illustrated herein, is not drawn to scale unless specifically described as such. Generally, substrate 2 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. Only a small portion of substrate 2 (as well as subsequently formed layers) is illustrated in the accompanying figures for the sake of simplicity and clarity, as such disclosure is sufficient for understanding the embodiments described herein.

One or more active and/or passive components (not illustrated) may also have been formed prior to the state illustrated in FIG. 1a. Components such as FinFET transistors, planar transistors, Gate All Around (GAA) transistors, capacitors, resistors and the like are within the contemplated scope of devices included within structure 10. In addition, local interconnects formed of conductive polysilicon or other conductive materials, inter layer dielectrics (ILDs), contact plugs, lower levels of interconnects such as metal layers embedded within respective dielectric layers, and the like are all within the contemplated scope of substrate 2 represented in FIG. 1a.

In this particular embodiment, a dual etch stop feature, including etch stop layer (ESL) 4 and ESL 6, is shown having been formed over substrate 2. The distinction between substrate 2 and layers formed over substrate 2 is somewhat arbitrary and for illustration only. In other words, in some embodiments, ESL 4 and/or ESL 6 could be considered as part of substrate 2, whereas in FIG. 1*a* they are illustrated separately. Those skilled in the art will appreciate that ESLs such as ESL 4 and ESL 6 are employed to protect underlying features/layers/structures of substrate 2 from subsequent processes, particularly subsequent etching and/or patterning processes, as will be demonstrated in the following paragraphs. In the present example, two ESLs, ESL 4 and ESL 6, are employed to ensure sufficient protection for the underlying features/layers/structures. This may be necessitated because of the size, complexity, shape, pattern density, material compositions, and the like of those underlying features/layers/structures and/or the size, complexity, shape, pattern density, material compositions, and the like of a subsequently formed material (such as a subsequently formed IMD layer described in the following paragraphs), and the etch/patterning processes used to pattern the subsequently formed material. In other embodiments, a single ESL may be sufficient and in yet other embodiments three or more ESLs might be required for sufficient protection of underlying features/layers/structures.

As but one example, ESL 4 may be an aluminum oxide (AlxOy) layer and ESL 6 may be an oxygen doped silicon carbide (sometimes referred to as oxygen doped carbide or "ODC") layer. While ODC layer 6 is illustrated as being formed over AlxOy layer 4, it is within the contemplated scope of this application that AlxOy layer 4 could alternatively be formed over ODC layer 6.

Continuing with FIG. 1*b*, a layer 8 is blanket deposited over ESL 4 and ESL 6, illustratively being formed directly on ESL 6. In an illustrative embodiment, dielectric layer 8 may serve as an IMD layer for the structure 10, but this function is simply one of many applications for the concepts disclosed herein. In this embodiment, layer 8 comprises thiophene, phenyl, or thiophenyl, as examples. As will be discussed in greater detail below, layer 8 changes at least one material property when exposed to a sufficient dosage of light within a specified wavelength, and may be referred to herein as photo-sensitive layer 8.

Photo-sensitive layer 8 may be deposited using a Chemical Vapor Deposition (CVD) process, such as flowing a precursor gas such as one or more of ethane, an alkene, an alkyne, or the like, at a flow rate ranging from about 10 sccm to about 1000 sccm, at a temperature typically of from about 50° C. to about 300° C., for example. Alternatively, photo-sensitive layer 8 could be deposited by a different deposition process, such as PECVD, MOCVD, CVD, ALD, or the like. The photosensitive layer 8 could comprise a material such as I-R, P—R, or the like, where I is Iodonium salt, P is Phosphorous, and R represent CxHy, or a COOH organic group. The use of an O2 or Cox plasma pretreat process will improve interface adhesion for the photosensitive layer 8 and hence will reduce or preferably eliminate peeling, particularly when the layer is deposited using CVD deposition processes.

While the thickness of photo-sensitive layer 8 will depend upon the specific application and structure being manufactured, as an example photo-sensitive layer 8 may be deposited to a nominal 10 nm to about 60 nm thickness.

FIG. 1*c* through 1*f* illustrate steps for patterning photo-sensitive layer 8 by taking advantage of its photo-sensitive properties. First, as shown in FIG. 1*c*, one or more cap layers are formed on the top surface of photo-sensitive layer 8. In an illustrative embodiment, a first dielectric cap layer 12 is formed by tetraethyl orthosilicate deposition (sometimes referred to as tetraethoxysilane, and commonly abbreviated as TEOS), followed by a second cap layer 14, formed of a metal such as tungsten, tungsten doped carbide, TIN, or the like. A third cap layer 16, such as another TEOS dielectric layer is then formed, followed by a fourth cap layer 18, such as an amorphous silicon dielectric cap layer. The specific materials and deposition processes disclosed for cap layers 12, 14, 16, and 18 oxide are by way of example only. The use and composition of the cap layers is a matter of design choice and depends upon factors such as etch selectivity of the underlying materials and the cap layer materials to the selected etch process, the required resolution and density of the resulting pattern, and other such process parameters. Various other materials and deposition processes are within the contemplated scope of this disclosure, including a lesser or a greater number of cap layers, provided that the combination and number of cap layers are sufficient to provide for the patterning function described with respect for FIG. 1*d* through 1*e*. For instance, other materials such as SiO2, SiOC, SiCO, SiN, and the like could readily be used for one or more of the cap layers, which would be deposited to a thickness of perhaps about 5 nm to about 70 nm in a typical embodiment.

Figure 1F:
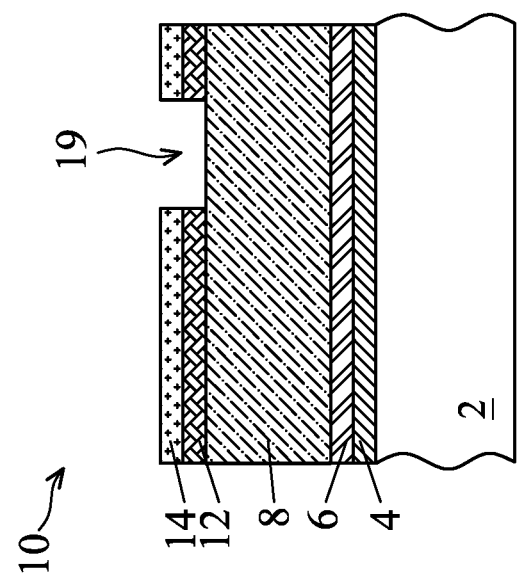
Figure 1E:
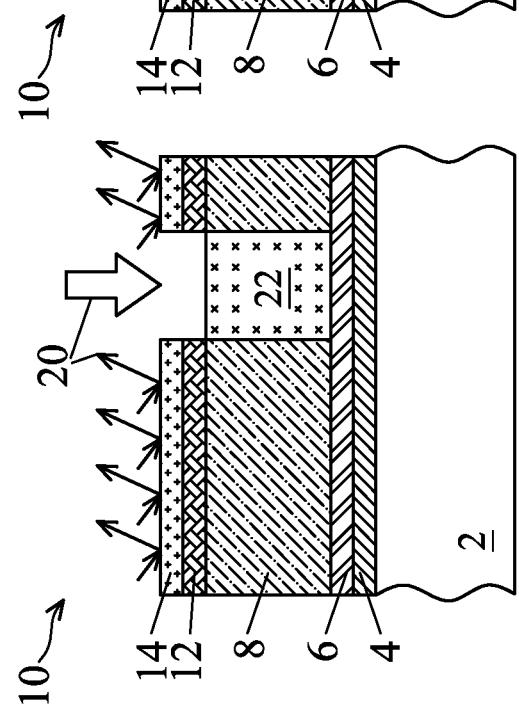
Figure 1D:
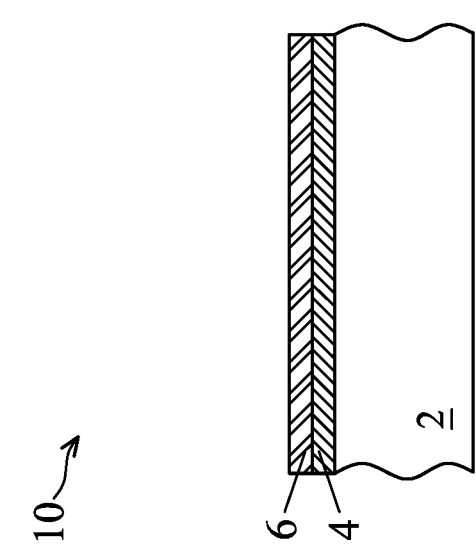

Continuing the discussion with FIG. 1*d*, illustrated therein is the result of a first patterning step wherein cap layers 12 and 14 are patterned to form an opening or trench 19 extending therethrough. This can be accomplished, e.g., by forming and patterning a photoresist layer (not shown) using well-known lithographic techniques to etch a pattern into cap layers 16 and 18 and then in a same or separate etch process etch the pattern into cap layers 12 and 14 to obtain the structure illustrated in FIG. 1*d*. Etch processes and compositions for etching through the demonstrative cap layers are well known and the details of which are not necessary to understanding the inventive concepts disclosed herein. Hence, those details are omitted for the sake of brevity and clarity. In the illustrated embodiment, cap layers 16 and 18 are removed (etched away) by the process of patterning cap layers 12 and 14. In other embodiments portions of cap layers 16 and 18 might remain, or even the entire cap layers might remain and be patterned similarly to cap layers 12 and 14. In still other embodiments, different patterning techniques, such as e-beam lithography, ion milling, and the like could be employed to pattern one or more of cap layers, 12, 14, 16, and/or 18.

As shown in FIG. 1*d*, after cap layers 12 and 14 are patterned a region of photo-sensitive layer 8 is exposed through opening 19, while remaining regions of photo-sensitive layer 8 remain unexposed, or covered, by cap layers 12 and 14. Although only a single opening 19 is illustrated in FIG. 1*d*, it should be apparent that numerous different openings of various sized and shapes can be simultaneously formed to expose numerous different regions of photo-sensitive layer 8.

A light exposure step is now performed, as schematically represented by arrows 20 in FIG. 1*e*. Those regions of photo-sensitive layer 8 exposed through opening 19 are subjected to (exposed to) incoming light 20, whereas cap layers 12 and/or 14 serve to block, absorb, and/or reflect incoming light 20 to keep the covered regions of photo-sensitive layer 8 from being subjected to (exposed to) incoming light 20. Hence, photo-sensitive layer 8 is exposed in a pattern that corresponds to the pattern imposed upon cap layers 12 and 14.

In response to exposure to incoming light 20, the exposed portions of photo-sensitive layer 8 change undergo a change in at least one material property. For instance, in the presently described embodiment, exposures to incoming light 20 causes an exposed region 22 of photo-sensitive layer 8 to undergo a change in its resistance to certain etch processes, such as by becoming significantly more susceptible to attack (removal) by the etch process. For instance, in the example wherein photo-sensitive layer 8 comprises thiophene, phenyl, thiophenyl, or the like, and incoming light 20 (which could be a light source, a laser, or the like) is in a wavelength range of about 200 nm to about 400 nm and at an exposure energy of perhaps about 10 mJ/cm2 to about 100 mJ/cm2, the exposed portions of photo-sensitive layer 8 become more susceptible to being etched by an etch process. While the specific etch selectivity between the exposed portion 22 and the unexposed portions of photo-sensitive layer 8 may vary and depend upon the particular application, an etch selectivity of from about 2× to about 50× is desirable.

FIG. 1*f* illustrates the results of one or more etch processes wherein exposed portions 22 of photo-sensitive layer 8 are removed. In one example, a first etch process, such as a wet etch using an organic acid or solvent is employed to remove exposed portions. This etch process will not significantly attack/remove ESL 6 (and/or ESL 4) and hence the process "stops" on the ESLs. Next, a second etch process, such as using CFx plasma, BCl3 plasma, or the like is employed to remove the ESLs. The result is an opening 23 through which underlying layers/features/structures of substrate 2 are exposed for subsequent electrical and/or physical connection. Significantly, the unexposed portions of photo-sensitive layer 8 (i.e., the portions that were not exposed to light 20 and hence did not undergo a material change) are relatively un-etched by the etch processes that removed the exposed portions 22. In other words, even though an anisotropic wet etch process was used to form opening 23, because of the photo-exposure step described with reference to FIG. 1*e*, the un-exposed portions of photo-sensitive layer 8 remain relatively un-etched and opening 23 will have relatively straight and vertical sidewalls. This allows for, e.g., greater packing density, tighter tolerances/process windows, and greater reliability of the resulting device.

Figure 2A:
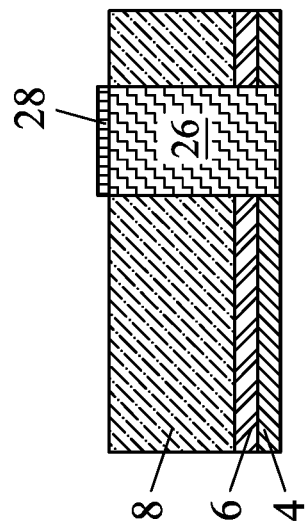
FIG. 2a through 2d illustrate steps in forming a conductive feature in the patterned photo-sensitive layer of FIG. 1e, and the structures resulting therefrom.

Various subsequent processing steps can next be employed to continue/complete manufacture of device 10. FIG. 2*a* through 2*d* illustrate steps in one embodiment wherein a conductive via 26 is formed in opening 23. For simplicity, substrate 2 is not illustrated in FIG. 2*a* through 2*d*, although it would be so in actual product and processes. Beginning with FIG. 2*a*, this figure illustrates the structure of FIG. 1*f* after opening 23 has been over-filled with conductive material 24. Conductive material 24 schematically represents one or more different layers and/or materials filling opening 23. For instance, conductive material 24 could include one more liners lining sidewalls of opening 23 (e.g., Ti, Tin, Ta, TaN, and the like), as well as one or more fill materials such as cobalt, copper, aluminum, tungsten, gold, platinum, doped polysilicon, and the like. It is within the contemplated scope of this disclosure that even dielectric liners could fall within the rubric of conductive material 24. In FIG. 2*a*, conductive material extends to or just above the top of ESL 6. In other embodiments (not specifically illustrated) conductive material 24 could extend over the top surfaces of ELS 6. In yet other embodiments, ESL 6 and/or ESL 4 could be fully or partially removed before depositing conductive material 24, in which case conductive material would overfill opening 23 and be at or above the top of photo-sensitive layer and possibly extending laterally on the top surface of photo-sensitive layer 8.

Figure 2B:
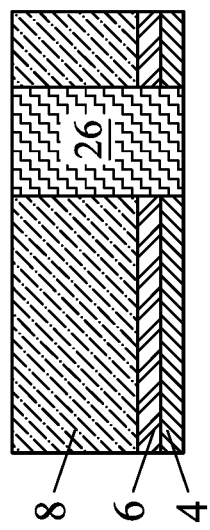

As illustrated in FIG. 2*b*, any overfilled portions of conductive material 24 are removed, resulting in conductive feature 26 being formed in hole 23. Conductive feature could just be, for instance, a conductive via, but could just as well be a contact, a plug, a wire, an interconnect, a pad or any other conductive feature. In most embodiments, conductive feature 26 electrically contacts an underlying feature, such as an underlying wire or interconnect, via, plug, or other feature such as a terminal for a transistor, capacitor, resistor, or the like. A planarization process such as a Chemical Mechanical Polish (CMP), an etch back, or the like can be employed to remove overfilled portions. Note that it is within the contemplated scope of the present disclosure that in some embodiments conductive material just fills, but does not overfill, opening 23, in which case no planarization step such as illustrated in FIG. 2*b* is needed.

Figure 2C:
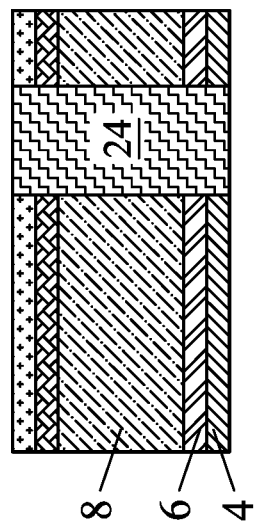
Figure 2D:
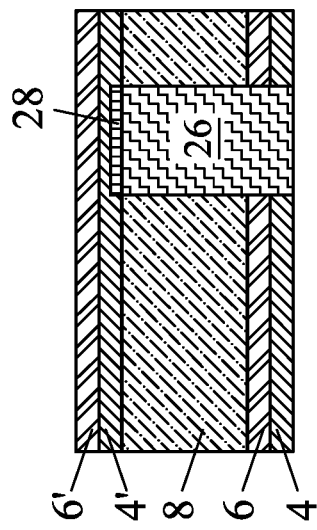

Proceeding to FIG. 2*c*, in some embodiments an optional metal capping layer such as a cobalt cap is formed over conductive feature 26. This metal capping layer may be particularly beneficial when conductive feature 26 is made of copper or in large part made of copper—in order to protect conductive feature 26 during subsequent processing steps. Optionally, additional conductive features can be manufactured by conventional techniques, or by repeating the processes illustrated in FIGS. 1*a*-1*f* and 2*a*-2*c*. For instance, as shown in FIG. 2*d*, additional etch stop layers such as 4' and 6' can be formed overlying photo-sensitive layer 8 and conductive feature 26 and the above-described process repeated to form a subsequent conductive feature in a next level of interconnection (not shown) above the level shown in FIG. 2*d*.

FIG. 3*a* through 3*g* illustrate another embodiment for forming conductive features in a photo-sensitive layer. Beginning with FIG. 3*a*, a substrate 32 is provided, which substrate 32 can be the same or similar to substrate 2 described above. In other words, substrate 32 can be a bulk semiconductor wafer, a multi-layer wafer such as an SOI substrate, could comprise silicon or other semiconductor materials, could be doped or undoped, etc. Further, as described above with reference to substrate 2, substrate 32 is contemplated encompass various layers/features/structures as may be formed in and on the wafer including but not limited to transistors, capacitors, resistors, interconnects, insulating layers, dielectric layer, metallization layers, and the like.

ESL layers 34 and 36 are deposited atop substrate 32. These ESL layers could be the same or similar to ESL layer 4 and 6 discussed above, but such similarity is not a requirement for this embodiment. Additionally, a single ESL layer or more than two ESL layers could be employed, provided the ESL layer or layers offer sufficient protection to underlying layers/features/structures during subsequent processing steps as described in the following paragraphs. FIG. 3*b* illustrates a photo-sensitive layer 38 is deposited on ESL layer 6. In this embodiment, photo-sensitive layer 38 is such that its conductivity changes significantly upon sufficient exposure to light energy of certain wavelengths. As an example, photo-sensitive layer 38 may be formed of phenyl or thiophenyl or combinations of phenyl and thiophenyl, as examples. Such material is sensitive to and changes its conductivity when exposed to light energy in the range of about 13.5 nm (Extreme Ultra Violet or EUV range).

In one example, photo-sensitive layer 38 is deposited using a CVD process such as flowing precursor gas such ethane, alkene, alkyne, or the like at a flow rate ranging from about 10 sccm to about 1000 sccm, and at a temperature typically of from about 50° C. to about 300° C., in an illustrative embodiment. Alternatively, photo-sensitive layer 38 could be deposited by a different deposition process, such as PECVD, MOCVD, CVD, ALD, and the like.

In the embodiment illustrated in FIG. 3*c*, multiple cap layers are blanket deposited atop photo-sensitive layer 38. In this case, first cap layer 42 and second cap layer 44 are made of material selected such that cap layers 42 and 44 are transparent or at least substantially transparent to light energy of the wavelengths to which photo-sensitive layer 38 is sensitive. For instance, in the case of phenyl and/or thiophenyl which are sensitive to light energy in the range described above, cap layers 42 and 44 are made from a material that is substantially transparent to that light wavelengths. For instance, cap layers 42 and/or 44 could be made of SiO2, SiOC, or the like. The cap layers should be deposited to a sufficient thickness that that function to protect underlying photo-sensitive layer 38 during subsequent process steps (described below) but thin enough to allow all or substantially all light energy (of the appropriate wavelengths) to pass through during the exposure step described below with regard to FIG. 3f. For instance, cap layers 42 and 44 could be deposited to a thickness of from about 5 nm to about 70 nm, in an illustrative embodiment. Although two transparent cap layers are illustrated, a single transparent or more than two transparent cap layers are within the contemplated scope of this disclosure provided the above function constraints regarding transparency, etc. are met.

FIG. 3c also illustrates two additional cap layers 46 and 48. These cap layers are employed for patterning transparent cap layers 42 and 44 and generally do not remain after the transparent cap layers have been patterned—and hence there is not a need for these cap layers to be transparent. Hence, a wider range of materials, both conductive and dielectric could be used for cap layers 46 and 48. In an embodiment, cap layer 46 is a TEOS oxide and cap layer 48 is amorphous silicon, although these layers could be used in reverse order.

FIG. 3d illustrates the results of patterning transparent cap layers 42 and 44 to form opening 49 extending through transparent cap layer 42 and 44. This can be accomplished, e.g., by forming and patterning a photoresist layer (not shown) using well-known lithographic techniques to etch a pattern into transparent cap layers 46 and 48 and then in a same or separate etch process etching the pattern into transparent cap layers 42 and 44 to obtain the structure illustrated in FIG. 3d. Etch processes and compositions for etching through the demonstrative cap layers are well known and the details of which are not necessary to understanding the inventive concepts disclosed herein. Hence, those details are omitted for the sake of brevity and clarity. In the illustrated embodiment, transparent cap layers 46 and 48 are removed (etched away) by the process of patterning transparent cap layers 42 and 44. In other embodiments portions of cap layers 46 and 48 might remain, or even the entire cap layers might remain and be patterned similarly to transparent cap layers 42 and 44. In still other embodiments, different patterning techniques, such as e-beam lithography, ion milling, and the like could be employed to pattern one or more of cap layers, 42, 44, 46, and/or 48.

FIG. 3e illustrates the results of filling opening 49 with a plug 50. Plug 50 should not be transparent to the light wavelengths to which photo-sensitive layer 38 is sensitive. A broad range of materials can hence be used for plug 50, which will subsequently be removed. In an embodiment, plug 50 could be made from an oxide, such as silicon oxide for instance. Although only a single plug 50 is illustrated in FIG. 3d, it should be apparent that numerous different openings 49 of various sized and shapes can be formed and filled with numerous plugs 50 to cover different regions of photo-sensitive layer 38. In some contemplated embodiments, plug 50 is formed through a selective deposition process where the material comprising plug 50 forms readily on the exposed surface of photo-sensitive layer 38 and does not form readily on the exposed surface of cap later 46. In other contemplated embodiments, the material comprising plug 50 could be blanket deposited over the entire device and then patterned through a photolithographic process, a CMP or other planarization process, or the like. Contrary to the embodiment described above with regard to FIGS. 1a through 1f, opening(s) 49 is aligned with regions of photo-sensitive layer 38 that will remain after subsequent processing (whereas in the above embodiment, opening(s) 19 was aligned to regions of photo-sensitive layer 8 that were subsequently removed in order to form conductive feature(s) 26. This is explained in the following paragraphs.

After plug 50 is formed, a light exposure step is performed, as schematically represented by arrows 52 in FIG. 3f. Light energy 52 is in pre-selected wavelength spectrum, such as EUV for instance. In other words, light energy 52 is of the wavelength that causes photo-sensitive layer 38 to change its conductivity properties when exposed thereto. The region of photo-sensitive layer 38 covered by plug 50 is protected from (not exposed by) light energy 52. By contrast, the regions of photo-sensitive layer 38 covered by transparent cap layers 42 and 44 are exposed to light energy 52 because transparent cap layers 42 and 44 are substantially transparent to the wavelengths of light energy 52. In response to exposure to incoming light 52, the exposed portions of photo-sensitive layer 38 undergo a change in at least one material property and in this embodiment those exposed portions convert from a dielectric to a conductor 54.

Exposed regions 54 (now conductive) can be in the form of contact plugs, pads, elongated wires, or other forms of interconnect and the remaining unexposed regions 38 can be in the form of a patterned insulating layer that electrically isolated the various exposed conductive regions 54 from one another (for clarity, those portions of photo-sensitive layer 38 that remain unexposed will henceforth be called unexposed portions 38, remaining portions 38, or the like in contrast to those portions of photo-sensitive layer 38 that were exposed which will henceforth be called exposed regions 54, conductive regions 54, or the like). If the remaining unexposed regions 38 are sufficiently insulating to perform this function during operation of the resulting circuit, then no further processing is required for forming an interconnect layer. It is contemplated, however, that the unexposed regions 38 may not be sufficient in terms of insulation, dielectric value, structural integrity, durability, reliability, and/or the like to form a part of the final product. FIG. 4a through 4f illustrate subsequent process steps that, if needed, remove unexposed portions 38 and replace them with dielectric material that may be more appropriate for the particular application. Although substrate 32 remains, for brevity and clarity substrate 32 is not illustrated in FIG. 4a through 4f.

Beginning with FIG. 4a, the structure illustrated in FIG. 3f is subjected to a process whereby plug 50 and remaining unexposed portions 38 are removed. The particular process (es) used to remove plug 50 and remaining unexposed portions 38 will depend upon the particular materials of these features. In a contemplated embodiment, etching, ashing, or the like can be employed to remove the features, resulting in opening 53. Note that in the illustrated embodiment, the ashing/etching process(es) may result in also removing some or all of transparent cap layer 44. This is a by-product of contemplated removal processes but it is not necessary that transparent cap layer 44 be removed. Conversely, it is illustrated that transparent cap layer 42 remains after the ashing/etching processes, but this too is simply a design choice and transparent cap layer 42 could likewise be removed (or not) during the ashing/etching process(es). Note also that opening 53 extends through ESL layers 34 and 36 in the illustrated embodiment—the result of the same or additional etching steps as used to remove plug 50 and/or remaining portions 38. It is not necessary, however, that ESL layer 34 and 36 be removed in opening 53, and in some embodiments (not illustrated) these layers remain at the bottom of opening 53.

Next, as illustrated in FIG. 4*b*, a metal isolation liner 56 may optionally be formed to line sidewalls and the bottom of opening 53. Metal isolation liner could be formed of a dielectric such as silicon oxide, silicon nitride, or the like, or in some embodiments metal isolation liner could be formed of a metal barrier such as titanium, titanium nitride, tantalum, tantalum nitride, or the like. In embodiments wherein metal isolation liner 56 is a metal barrier, the liner is removed from the bottom of opening 53, as shown in FIG. 4*c*.

Then, as shown in FIG. 4*c*, lined opening 53 is filled or overfilled with a dielectric material 58. The dielectric material and deposition technique is a matter of design choice, but it is contemplated that a flowable Extra Low K (ELK) dielectric material be employed because of the advantageous properties of good gap filling capability and low dielectric constant properties. If needed, excess dielectric material 58 can be removed through a CMP process, an etch back process, or other planarization process, resulting in formation of dielectric feature 60 electrically isolating conductive exposed regions 54, as illustrated in FIG. 4*d*. The result is a level of electrically conductive features formed of the exposed (now conductive) regions 54 that were formed from photo-sensitive layer 38, electrically isolated and physically separated by dielectric features 60 formed in the gaps left behind when unexposed portions of photo-sensitive layer 38 were removed. While not necessary, optionally additional interconnect layers can be stacked atop the intermediate structure shown in FIG. 4*d* by repeating the process steps illustrated in FIG. 3*a* through 4*d*. For instance, as shown in FIG. 4*e*, an optional capping layer 62 can be formed over conductive exposed portions 54 to protect them against subsequent processes and, as shown in FIG. 4*f*, a next level of ESL layers 34' and 36' can be formed over capping layer 62 and dielectric feature 60. In a contemplated embodiment, capping layer 62 could comprise cobalt, although other materials are similarly contemplated.

Another embodiment process for converting a photo-sensitive layer into a layer with conductive regions is illustrated in FIG. 5*a* through 5*j*. Beginning with FIG. 5*a*, an intermediate state of manufacture is illustrated in which ESL layers 74 and 76 have been formed atop substrate 72. Substrate 72 can be the same or similar to substrate 2 described above. In other words, substrate 72 can be a bulk semiconductor wafer, a multi-layer wafer such as an SOI substrate, could comprise silicon or other semiconductor materials, could be doped or undoped, etc. Further, as described above with reference to substrate 2, substrate 72 is contemplated encompass various layers/features/structures as may be formed in and on the wafer including but not limited to transistors, capacitors, resistors, interconnects, insulating layers, dielectric layer, metallization layers, and the like.

ESL layers 74 and 76 are deposited atop substrate 72. These ESL layers could be the same or similar to ESL layers 34 and 36 discussed above, but such similarity is not a requirement for this embodiment. Additionally, a single ESL layer or more than two ESL layers could be employed, provided the ESL layer or layers offer sufficient protection to underlying layers/features/structures during subsequent processing steps as described in the following paragraphs. In this embodiment, ESL 74 is a layer of aluminum nitride, for instance, and ESL 76 is a layer of ODC, for example. Other materials are also within the contemplated scope of this disclosure, provided the materials provide sufficient protection for the underling layers/features/structures of substrate 72 during subsequent processes as described in the following paragraphs.

FIG. 5*b* illustrates a photo-sensitive layer 78 is deposited on ESL layer 76. In this embodiment, photo-sensitive layer 78 is a monomer such that its conductivity changes significantly upon sufficient exposure to light energy of certain wavelengths, and in this way the above teaching regarding photo-sensitive layer 38 is applicable to photo-sensitive layer 78. For brevity and clarity, the above discussion regarding materials, properties, and processes for photo-sensitive layer 38 are incorporated herein with regard to photo-sensitive layer 78 by reference.

In this embodiment, however, a photos-sensitive layer 78, such as thiophene, is deposited, preferably using a spin-on deposition technique. Thiophene is but one example of an oligomer, i.e. a low molecular weight polymer.

As illustrated in FIG. 5*c*, cap layers are formed on photo-sensitive layer 78. In this embodiment, only two transparent cap layers 82 and 84 are illustrated. Depending upon the material selected, it may be possible to directly pattern transparent cap layers 82 and 84 without the use of additional capping layers. Alternatively, transparent cap layer 82 and 84 could be used in conjunction with additional cap layers such as cap layers 46 and 48 of FIG. 3*c* in those applications where they are needed to more accurately pattern transparent cap layers 82 and 84. These additional cap layers could be the same materials as described with reference to FIG. 3*c*, or could be other materials provided they are compatible with transparent cap layers 82 and 84 and with the processes described in this embodiment.

FIG. 5*d* illustrates the results of patterning transparent cap layers 82 and 84 to form an opening therein, filling the opening with a plug 86, and then exposing the device to a light energy source having a light energy schematically illustrated by arrows 88. Assuming thiophene is the photo-sensitive layer 78, light energy 88 should have a wavelength in the range of from about 200 nm to about 400 nm in order to activate the photo-sensitive properties of photo-sensitive layer 78. Plug 86 should be opaque (not transparent) at these wavelengths in order to protect photos-sensitive material underlying the plug. Materials such as SiO2, SiOC, and the like are transparent to light at these wavelengths and could be employed for plug 86. Transparent cap layers 82 and 84 should be transparent or at least substantially transparent to these wavelengths to allow sufficient light energy to pass through them and expose (activate) the underlying regions of photo-sensitive layer 78. Materials such as SiO2, SiOC, and the like at a thickness range of from about 5 nm to about 70 nm are illustrative examples for transparent cap layers 82 and 84.

During the light exposure process, the region of photo-sensitive layer 78 covered by plug 86 is protected from (not exposed by) light energy 88. By contrast, the regions of photo-sensitive layer 78 covered by transparent cap layers 82 and 84 are exposed to light energy 88 because transparent cap layers 82 and 84 are substantially transparent to the wavelengths of light energy 88. In response to exposure to incoming light 88 in an illustrative range of from about 10 mJ/cm2 to about 100 mJ/cm2, the exposed portions of photo-sensitive layer 78 undergo a change in at least one material property and in this embodiment those exposed portions convert from dielectric to conductive regions 90 (for clarity, those portions of photo-sensitive layer 78 that remain unexposed will henceforth be called unexposed portions 78, remaining portions 78, or the like in contrast to those portions of photo-sensitive layer 78 that were exposed which will henceforth be called exposed regions 90, conductive regions 90, or the like).

Exposed regions 90 (now conductive) can be in the form of contact plugs, pads, elongated wires, or other forms of interconnect and the remaining unexposed regions 78 can be in the form of a patterned insulating layer that electrically isolated the various exposed conductive regions 90 from one another. If the remaining unexposed regions 78 are sufficiently insulating to perform this function during operation of the resulting circuit, then no further processing is required for forming an interconnect layer. It is contemplated, however, that the unexposed regions 78 may not be sufficient in terms of insulation, dielectric value, structural integrity, durability, reliability, and/or the like to form a part of the final product. FIG. 5e through 5j illustrate subsequent process steps that, if needed, remove unexposed portions 78 and replace them with dielectric material that may be more appropriate for the particular application.

Beginning with FIG. 5e, the structure illustrated in FIG. 5d is subjected to a process whereby plug 86 and remaining unexposed portions 78 are removed. The particular process (es) used to remove plug 8 and remaining unexposed portions 78 will depend upon the particular materials of these features. In a contemplated embodiment, etching, ashing, or the like can be employed to remove the features, schematically illustrated by arrows 89 in FIG. 5e. The result is opening 91. Note that in the illustrated embodiment, the ashing/etching process(es) 89 may result in also removing some or all of transparent cap layer 84. This is a by-product of contemplated removal processes but it is not necessary that transparent cap layer 84 be removed. Conversely, it is illustrated that transparent cap layer 82 remains after the ashing/etching processes, but this too is simply a design choice and transparent cap layer 82 could likewise be removed (or not) during the ashing/etching process(es). Note also that opening 91 extends through ESL layers 74 and 76 in the illustrated embodiment—the result of the same or additional etching steps as used to remove plug 86 and/or remaining portions 78. It is not necessary, however, that ESL layer 74 and 376 be removed in opening 91, and in some embodiments (not illustrated) these layers remain at the bottom of opening 91.

Next, as illustrated in FIG. 5f, a metal isolation liner 92 may optionally be formed to line sidewalls and the bottom of opening 91. Metal isolation liner could be formed of a dielectric such as silicon oxide, silicon nitride, or the like, or in some embodiments meta isolation liner could be formed of a metal barrier such as titanium, titanium nitride, tantalum, tantalum nitride, or the like. In the illustrated embodiment, FIG. 5g, metal isolation liner 92 is removed from the bottom portion of opening 91. In some embodiments, however, metal isolation liner 92 could be left remaining at the bottom of opening 91.

Then, as shown in FIG. 5g, lined opening 91 is filled or overfilled with a dielectric material 96. The dielectric material and deposition technique is a matter of design choice, but it is contemplated that a flowable Extra Low K (ELK) dielectric material be employed because of the advantageous properties of good gap filling capability and low dielectric constant properties. If needed, excess dielectric material 96 can be removed through a CMP process, an etch back process, or other planarization process, resulting in formation of dielectric feature 97 electrically isolating conductive exposed regions 90, as illustrated in FIG. 5g. The result is a level of electrically conductive features formed of the exposed (now conductive) regions 90 that were formed from photo-sensitive layer 78, electrically isolated and physically separated by dielectric features 97 formed in the gaps left behind when unexposed portions of photo-sensitive layer 78 were removed. While not necessary, optionally additional interconnect layers can be stacked atop the intermediate structure shown in FIGS. 5i and 6j by repeating the process steps illustrated in FIG. 5a through 5d. For instance, as shown in FIG. 5i, an optional capping layer 98 can be formed over conductive exposed portions 90 to protect them against subsequent processes and, as shown in FIG. 5i, and a next level of ESL layers 74' and 76' can be formed over capping layer 98 and dielectric feature 97. In a contemplated embodiment, capping layer 98 could comprise cobalt, although other materials are similarly contemplated.

Figure 7:
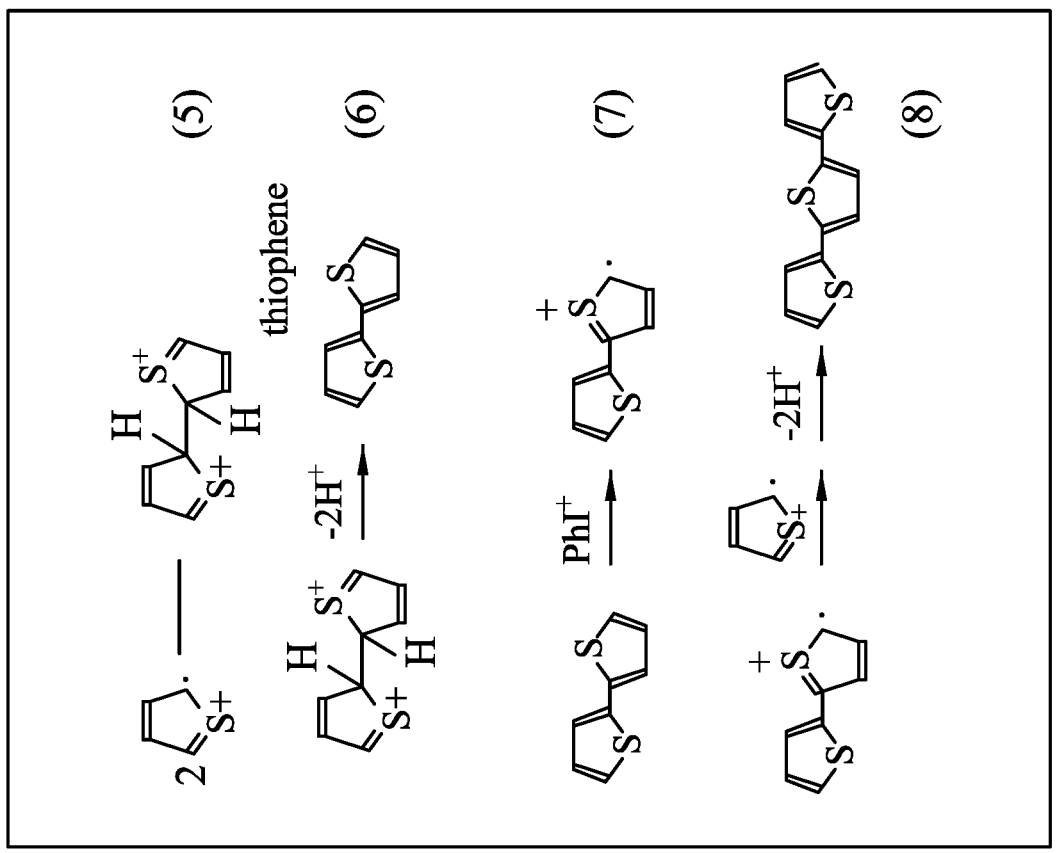
FIGS. 6 and 7 illustrate properties of illustrative photo-sensitive materials.
Figure 6:
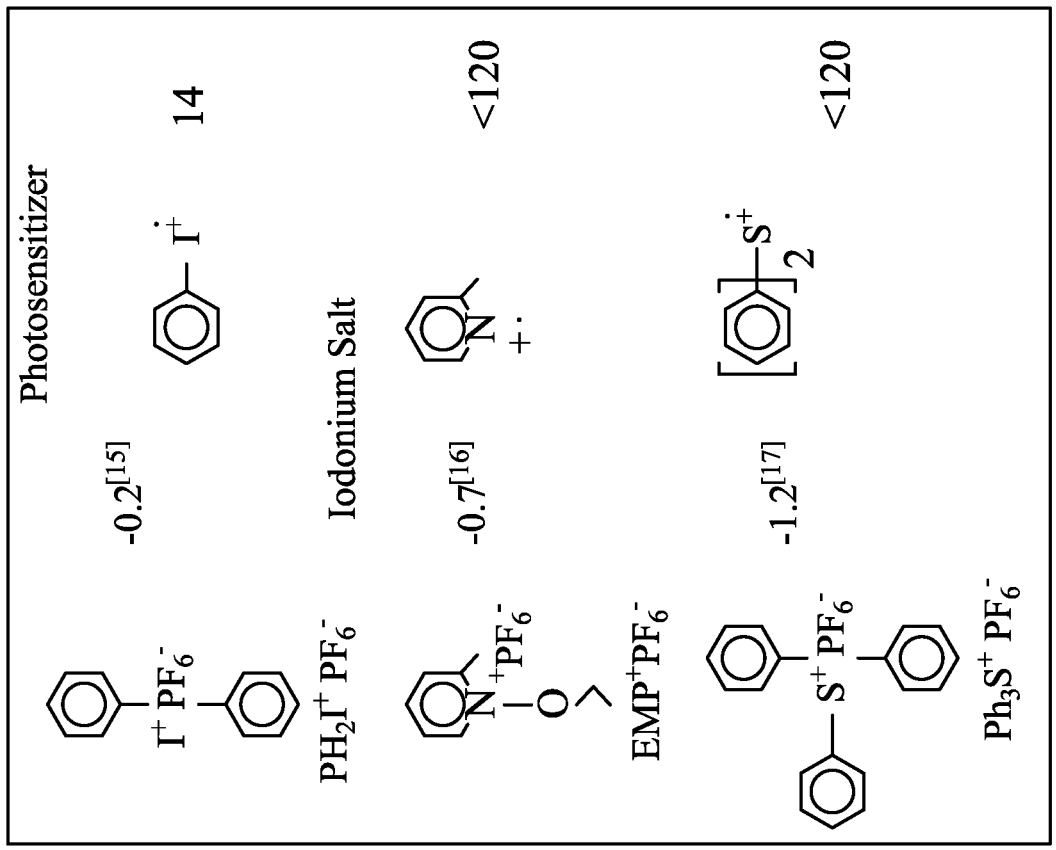

FIGS. 6 and 7 provide additional information about the chemical composition of the photo-sensitive layers used in the embodiments described herein.

One general aspect of embodiments disclosed herein includes forming a photo-sensitive material over a substrate. The method also includes forming a cap layer over the photo-sensitive material. The method also includes patterning the cap layer. The method also includes using the patterned cap layer, selectively exposing a first portion of the photo-sensitive material to a pre-selected light wavelength to change at least one material property of the first portion of the photo-sensitive material, while preventing a second portion of the photo-sensitive material from being exposed to the pre-selected light wavelength. The method also includes and performing one, but not both of the following steps: removing the first portion of the photo-sensitive material and forming in its place a conductive element at least partially surrounded by the second portion of the photo-sensitive material. The method also includes removing the second portion of the photo-sensitive material and forming from the first portion of the photo-sensitive material a conductive element electrically connecting two or more portions of a circuit.

Another general aspect of embodiments disclosed herein includes depositing on a substrate a photo-sensitive material. The method also includes selectively exposing first portions of the photo-sensitive material to a pre-selected wavelength of light in order to change at least one material property of the first portions of the photo-sensitive material, while not exposing second portions of the photo-sensitive material to the pre-selected wavelength of light. The method also includes incorporating the photo-sensitive material into an electrical interconnection of an integrated circuit.

Yet another general aspect of embodiments disclosed herein includes a substrate. The device also includes an electrical interconnection circuit formed over the substrate, the electrical interconnection circuit having a least two levels, each of the two levels including: a layer of photo-sensitive material, the layer having regions of conductive photo-sensitive material, and the layer further having trenches therein. The device also includes and an insulating material formed within the trenches and electrically insulating the regions of conductive photo-sensitive material.

Some embodiments disclosed herein provide for a method of forming a device, which includes forming over a substrate a layer of photo-sensitive material, the photo-sensitive material having a first dielectric value. The method also includes forming a mask over a first region of the photo-sensitive material while leaving a second region of the photo-sensitive material exposed. The method also includes changing the dielectric value of the second region of the photo-sensitive material to a second, lower dielectric value by exposing the second region of the photo-sensitive material to a pre-selected wavelength of light energy, while leaving the dielectric value of the first region of the photo-sensitive material unchanged.

Other embodiments disclosed herein provide for method including forming a photo-sensitive material over a substrate, and forming a patterned cap layer over the photo-sensitive material. The method also includes using the patterned cap layer, selectively exposing a first portion of the photo-sensitive material to a pre-selected wavelength of light energy to change at least one material property of the first portion of the photo-sensitive material, while leaving the at least one material property of a second portion of the photo-sensitive material unchanged by the exposure process. The method also includes preventing a second portion of the photo-sensitive material from being exposed to the pre-selected wavelength of light energy.

Yet other embodiments disclosed herein provide for a method of forming a device, which method includes forming over a substrate a layer of photo-sensitive material and forming over a first region of the photo-sensitive material a cap layer, the cap layer being transparent to a pre-selected wavelength of light energy. The method also includes forming over a second region of the photo-sensitive material a plug, the plug being opaque to the pre-selected wavelength of light energy. The method also includes converting the first region of the photo-sensitive material from a dielectric to a conductor by exposing the first region to the pre-selected wavelength of light energy, while leaving the second region of the photo-sensitive material unconverted as a dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, the method comprising:
   forming over a substrate a layer of photo-sensitive material, the photo-sensitive material having a first dielectric value;
   forming a mask over a first region of the photo-sensitive material while leaving a second region of the photo-sensitive material exposed; and
   changing the dielectric value of the second region of the photo-sensitive material to a second, lower dielectric value by exposing the second region of the photo-sensitive material to a pre-selected wavelength of light energy, while leaving the dielectric value of the first region of the photo-sensitive material unchanged.

2. The method of claim 1 wherein the step of forming over a substrate a layer of photo-sensitive material includes depositing a material selected from the group consisting of phenyl, thiophenyl, and combinations of phenyl and thiophenyl.

3. The method of claim 1, wherein the step of forming a mask over a first region of the photo-sensitive material includes:
   forming the mask over the photo-sensitive material, the mask being transparent to the pre-selected wavelength of light energy;
   patterning the mask to have an opening therein; and
   forming in the opening a plug, the plug being opaque to the pre-selected wavelength of light energy.

4. The method of claim 1, wherein the mask is opaque to the pre-selected wavelength of light energy and further wherein the photo-sensitive material is exposed to the pre-selected wavelength of light energy through openings formed in the mask.

5. The method of claim 1, wherein the step of forming a mask over a first region of the photo-sensitive material includes depositing a layer selected from the group consisting of silicon oxide and silicon carbon oxide over the photo-sensitive material to a thickness of from about 5 nm to about 70 nm.

6. The method of claim 1, wherein the step of forming over a substrate a layer of photo-sensitive material rate includes depositing a photo-sensitive material selected from the group consisting of an I—R compound, and a P—R compound, where R represents a CxHy group or a COOH group.

7. The method of claim 1, wherein the step of changing the dielectric value of the second region of the photo-sensitive material includes exposing the second region of the photo-sensitive material to light having a wavelength of from about 200 nm to about 400 nm, to achieve an exposure energy of from about 10 mJ/cm$^2$ to about 100 mJ/cm$^2$.

8. The method of claim 1, wherein the step of changing the dielectric value of the second region of the photo-sensitive material includes exposing photo-sensitive that was deposited with a CVD process to EUV light, or exposing photo-sensitive that was deposited with a spin-on process to a fixed wavelength of light.

9. A method comprising:
   forming a photo-sensitive material over a substrate;
   forming a patterned cap layer over the photo-sensitive material;
   using the patterned cap layer, selectively exposing a first portion of the photo-sensitive material to a pre-selected wavelength of light energy to change at least one material property of the first portion of the photo-sensitive material, while leaving the at least one material property of a second portion of the photo-sensitive material unchanged by the exposure process; and
   preventing a second portion of the photo-sensitive material from being exposed to the pre-selected wavelength of light energy.

10. The method of claim 9, further comprising removing the patterned cap layer.

11. The method of claim 9, wherein the patterned cap layer is opaque to the pre-selected wavelength of light energy, and further wherein the at least one material property is resistance to an etch process.

12. The method of claim 9, wherein the patterned cap layer is transparent to the pre-selected wavelength of light energy, and further wherein the at least one material property is conductivity.

13. The method of claim 9, wherein the patterned cap layer is opaque to the pre-selected wavelength of light energy and further wherein the step of using the patterned cap layer, selectively exposing a first portion of the photo-sensitive material to a pre-selected light wavelength of light energy includes exposing portions of the photo-sensitive material through an opening in the patterned cap layer.

14. The method of claim 9, wherein the patterned cap layer is transparent to the pre-selected wavelength of light energy and further wherein the step of using the patterned cap layer, selectively exposing a first portion of the photo-sensitive material to a pre-selected light wavelength of light energy includes forming in the patterned cap layer a plug that is opaque to the pre-selected wavelength of light energy.

15. The method of claim 9, wherein the step of selectively exposing a first portion of the photo-sensitive material to a pre-selected light wavelength of light energy to change at least one material property of the first portion of the photo-sensitive material, increases the susceptibility of the first portion of the photo-sensitive material to an etch process.

16. The method of claim 15, further comprising subjecting the photo-sensitive material to an etch process to remove the first portion of the photo-sensitive material.

17. A method of forming a device, the method comprising:
   forming over a substrate a layer of photo-sensitive material 38, 78;
   forming over a first region of the photo-sensitive material a cap layer 12, 42 the cap layer being transparent to a pre-selected wavelength of light energy;
   forming over a second region of the photo-sensitive material a plug 50, 86, the plug being opaque to the pre-selected wavelength of light energy; and
   converting the first region of the photo-sensitive material from a dielectric to a conductor by exposing the first region to the pre-selected wavelength of light energy, while leaving the second region of the photo-sensitive material unconverted as a dielectric.

18. The method of claim 17, wherein the second region of photo-sensitive material electrically insulates the first region of photo-sensitive material after the first region of photo-sensitive material has been converted to a conductor.

19. The method of claim 17, further comprising:
   removing the second region of photo-sensitive material to form a trench in the layer of photo-sensitive material; and
   filing the trench with an insulator.

20. The method of claim 17, wherein the step of includes depositing a material selected from the group consisting thiophene, phenyl, and thiophenyl.

* * * * *